United States Patent
Takasu

(10) Patent No.: US 8,278,714 B2
(45) Date of Patent: Oct. 2, 2012

(54) SEMICONDUCTOR DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 180 days.

(21) Appl. No.: 12/924,263

(22) Filed: Sep. 23, 2010

(65) Prior Publication Data

US 2011/0073948 A1 Mar. 31, 2011

(30) Foreign Application Priority Data

Sep. 25, 2009 (JP) ................................. 2009-221243

(51) Int. Cl.
*H01L 21/00* (2006.01)

(52) U.S. Cl. .......................... 257/355; 257/358; 257/529

(58) Field of Classification Search .................. 257/355, 257/358, 529
See application file for complete search history.

(56) References Cited

U.S. PATENT DOCUMENTS

| | | | |
|---|---|---|---|
| 5,620,920 A * | 4/1997 | Wilmsmeyer | 438/227 |
| 5,854,504 A * | 12/1998 | Consiglio | 257/358 |
| 5,897,348 A * | 4/1999 | Wu | 438/200 |
| 6,004,838 A * | 12/1999 | Ma et al. | 438/200 |
| 6,022,769 A * | 2/2000 | Wu | 438/200 |
| 6,100,125 A * | 8/2000 | Hulfachor et al. | 438/224 |
| 6,489,662 B1 * | 12/2002 | Takasu | 257/529 |
| 6,587,320 B1 * | 7/2003 | Russ et al. | 361/56 |
| 7,420,250 B2 * | 9/2008 | Lee et al. | 257/355 |
| 7,750,409 B2 * | 7/2010 | Takasu et al. | 257/355 |
| 7,893,497 B2 * | 2/2011 | Takasu | 257/355 |
| 7,898,035 B2 * | 3/2011 | Takasu et al. | 257/355 |
| 7,999,324 B2 * | 8/2011 | Shigyo et al. | 257/360 |
| 2002/0084487 A1 * | 7/2002 | Takasu | 257/347 |
| 2002/0145176 A1 * | 10/2002 | Takasu et al. | 257/529 |
| 2002/0145177 A1 * | 10/2002 | Takasu et al. | 257/529 |
| 2006/0043491 A1 * | 3/2006 | Lee et al. | 257/355 |
| 2006/0125023 A1 * | 6/2006 | Shigyo et al. | 257/384 |
| 2009/0039431 A1 * | 2/2009 | Takasu | 257/360 |
| 2009/0050966 A1 * | 2/2009 | Takasu | 257/355 |
| 2009/0050967 A1 * | 2/2009 | Takasu | 257/355 |

(Continued)

FOREIGN PATENT DOCUMENTS

JP 2000323655 A * 11/2000

(Continued)

OTHER PUBLICATIONS

Patent Abstracts of Japan, publication No. 2002-231886, publication date Aug. 16, 2002.

*Primary Examiner* — Laura Menz
(74) *Attorney, Agent, or Firm* — Adams & Wilks

(57) ABSTRACT

A semiconductor device has an external connection terminal, an internal circuit region, an ESD protection N-MOS transistor provided between the external connection terminal and the internal circuit region to protect an internal element formed in the internal circuit region, and a shallow trench structure provided to isolate the ESD protection N-MOS transistor. A thin insulating film is formed on a drain region of the ESD protection N-MOS transistor. An electrode is disposed above the drain region and on the thin insulating film for receiving a signal from the external connection terminal. The thin insulating film has a film thickness and film properties that allow dielectric breakdown and establish conduction between the electrode and the drain region when a voltage exceeding an absolute maximum rating of the semiconductor device is applied to the electrode.

8 Claims, 1 Drawing Sheet

U.S. PATENT DOCUMENTS

| | | | |
|---|---|---|---|
| 2009/0050968 A1* | 2/2009 | Takasu et al. | 257/355 |
| 2009/0050969 A1* | 2/2009 | Takasu | 257/360 |
| 2009/0152633 A1* | 6/2009 | Takasu et al. | 257/360 |
| 2011/0073947 A1* | 3/2011 | Takasu | 257/355 |
| 2011/0073948 A1* | 3/2011 | Takasu | 257/355 |
| 2011/0163384 A1* | 7/2011 | Takasu | 257/355 |
| 2012/0032270 A1* | 2/2012 | Okumura et al. | 257/368 |

FOREIGN PATENT DOCUMENTS

| | | | | |
|---|---|---|---|---|
| JP | 2001320018 A | * | 11/2001 | |
| JP | 2002124569 A | * | 4/2002 | |
| JP | 2002124641 A | * | 4/2002 | |
| JP | 2002246549 A | * | 8/2002 | |
| JP | 2002313923 A | * | 10/2002 | |
| JP | 2002313924 A | * | 10/2002 | |
| JP | 2003100873 A | * | 4/2003 | |
| JP | 2003100874 A | * | 4/2003 | |
| JP | 2003174094 A | * | 6/2003 | |
| JP | 2009049259 A | * | 3/2009 | |
| JP | 2009049295 A | * | 3/2009 | |
| JP | 2009049296 A | * | 3/2009 | |
| JP | 2009049331 A | * | 3/2009 | |
| JP | 2009060081 A | * | 3/2009 | |
| JP | 2009147001 A | * | 7/2009 | |
| JP | 2011071325 A | * | 4/2011 | |
| JP | 2011071327 A | * | 4/2011 | |
| JP | 2011071328 A | * | 4/2011 | |
| JP | 2011071329 A | * | 4/2011 | |
| JP | 2011124516 A | * | 6/2011 | |
| JP | 2011138965 A | * | 7/2011 | |
| JP | 2011142189 A | * | 7/2011 | |
| JP | 2011142190 A | * | 7/2011 | |
| JP | 2011192842 A | * | 9/2011 | |
| JP | 2011192843 A | * | 9/2011 | |
| JP | 2011210896 A | * | 10/2011 | |

* cited by examiner

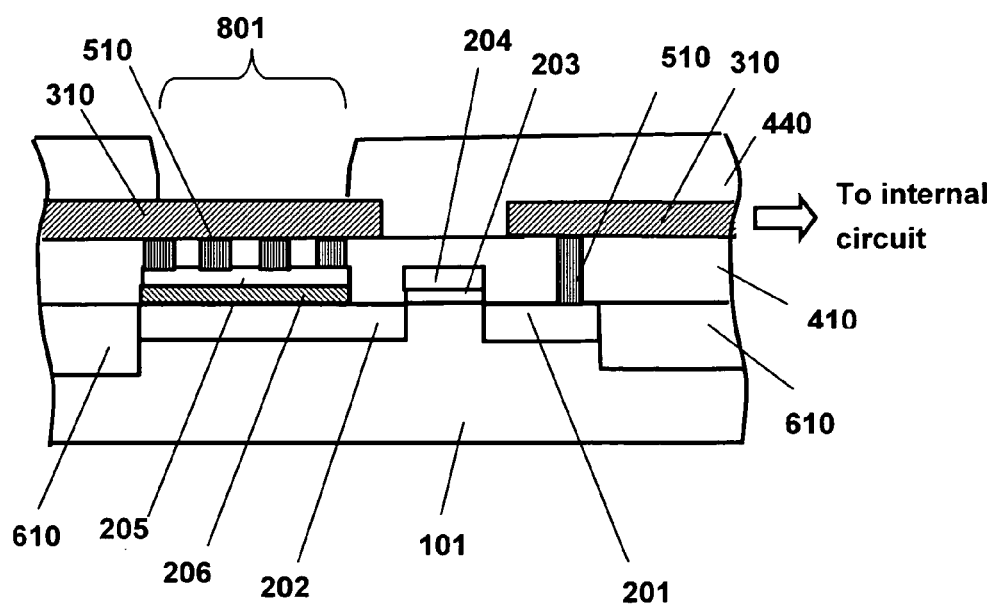

SEMICONDUCTOR DEVICE

BACKGROUND OF THE INVENTION

1. Field of the Invention

The present invention relates to a semiconductor device having MOS transistors in which an N-MOS transistor is used as an ESD protection element and whose element isolation structure includes shallow trench isolation.

2. Description of the Related Art

In a semiconductor device including MOS transistors, it is a well known practice to install an "off" transistor, which is an N-MOS transistor whose gate electric potential is fixed to a ground voltage (Vss) to keep in an off state, as an ESD protection element for preventing the breakdown of an internal circuit due to static electricity from an external connection PAD.

The off transistor is usually designed to have a wide transistor width W of the order of several hundreds microns because, unlike other MOS transistors that constitute internal circuits such as a logic circuit, the off transistor needs to permit a sudden flow of a large amount of current caused by the static electricity.

Since the off transistor, although kept in an off state by fixing the gate potential to Vss, has a threshold of 1 V or less as N-MOS transistors of internal circuits have, a certain amount of sub-threshold current generates. A wide width W of the off transistor as mentioned above causes a large off-leak current during the standby period, posing a problem by increasing the overall standby current consumption of an IC to which the off transistor is mounted.

In a semiconductor device using shallow trench isolation as an element isolation structure, in particular, regions prone to cause leak current, such as a crystal defect layer, are found in the vicinity of a shallow trench due to the isolation structure itself or a fabrication method of the isolation structure, thereby making the off leak current of the off transistor an even greater problem.

An improvement for reducing the leak current of the protection element has been proposed in which a plurality of transistors are arranged between a power supply (Vdd) and a ground (Vss) such that the transistors are completely turned off (see JP 2002-231886 A, for example).

However, reducing the width W in order to keep the off leak current of the off transistor small renders the off transistor incapable of implementing its protection function satisfactorily. The proposed remedy also has a problem of an increase in cost for the semiconductor device because of the significant increase in the occupation area by the plurality of transistors arranged between a power supply line (Vdd) and a ground line (Vss) to turn off the transistors completely.

SUMMARY OF THE INVENTION

In order to solve those problems, the present invention provides a semiconductor device structured as follows.

The semiconductor device includes an ESD protection N-MOS transistor which is provided between an external connection terminal and an internal circuit region to protect an internal element formed in the internal circuit region. The ESD protection N-MOS transistor is isolated from another element by a shallow trench structure and includes a drain region on which a thin insulating film is formed. An electrode which receives a signal from the external connection terminal is formed on the thin insulating film.

Further, in the semiconductor device, the thin insulating film formed on the drain region of the ESD protection N-MOS transistor is set to a film thickness and film properties that allow dielectric breakdown and establish conduction between the electrode which receives a signal from the external connection terminal and the drain region of the ESD protection N-MOS transistor when a voltage exceeding an absolute maximum rated voltage of the semiconductor device is applied to the electrode which receives the signal from the external connection terminal.

With the structural and functional arrangement described above, a semiconductor device with an ESD protection N-MOS transistor with reduced off leak current and having a satisfactory ESD protection function is obtained.

BRIEF DESCRIPTION OF THE DRAWING

The accompanying drawing, FIG. 1, is a schematic sectional view illustrating an ESD protection N-MOS transistor of a semiconductor device according to a first embodiment of the present invention.

DETAILED DESCRIPTION OF THE PREFERRED EMBODIMENT

FIG. 1 is a schematic sectional view illustrating an ESD protection N-MOS transistor of a semiconductor device according to an embodiment of the present invention.

A source region 201 and a drain region 202 are formed of high concentration N-type impurity regions on a P-type silicon substrate 101. A gate insulating film 203 which is a silicon oxide film or the like is provided on a channel region located between the source region 201 and the drain region 202. A gate electrode 204 is formed of polysilicon or the like on top of the gate insulating film 203. The ESD protection N-MOS transistor is insulated and isolated from another element by a shallow trench structure, and the perimeter of the transistor is surrounded by trench isolation regions 610.

A thin insulating film 206 is formed on the drain region 202 and made of a silicon oxide film, or a composite film of a silicon oxide film and a silicon nitride film, or the same film as is used for a tunnel insulating film of an EEPROM which is formed in an internal circuit region (not shown). An electrode 205 is formed of a polysilicon film or the like on the thin insulating film 206, and is connected to first metal wiring 310 through a contact hole 510.

A protective film 440 is formed on the metal wiring 310. A part of the protective film 440 is removed to constitute an external connection terminal region 801. The film thickness and film properties of the thin insulating film 206 are set such that, when a voltage exceeding the absolute maximum rated voltage of the semiconductor device is applied to the electrode 205, which receives a signal from the external connection terminal region 801, dielectric breakdown occurs and establishes conduction between the electrode 205 and the drain region 202.

By setting the thin insulating film 206 to an appropriate combination of film thickness and film properties, dielectric breakdown can be caused at a desired applied voltage, thus establishing conduction between the electrode 205 which receives a signal from the external connection terminal region 801 and the drain region 202 of the ESD protection N-MOS transistor.

With the thin insulating film 206 set in this manner, when a signal having a voltage equal to or lower than a power supply voltage is applied to the external terminal in a normal operation state of the semiconductor device, the electrode 205 which receives a signal form the external connection terminal region 801 and the drain region 202 are insulated and isolated from each other, and a signal (voltage) applied to the external connection terminal region 801 is not transmitted to the drain region 202 of the ESD protection N-MOS transistor. Off leak current is thus basically prevented in the ESD protection N-MOS transistor unless a high voltage such as an ESD pulse is applied.

When a high voltage exceeding the absolute maximum rated voltage (for example, an ESD pulse) is applied to the external connection terminal region 801, dielectric breakdown occurs and electricity is conducted between the electrode 205 which receives a signal form the external connection terminal region 801 and the drain region 202 of the ESD protection N-MOS transistor, thereby putting the ESD protection N-MOS transistor into a bipolar operation and efficiently releasing ESD pulse current into the ESD protection N-MOS transistor. Through those operations, the function of protecting internal circuit elements is fully exerted.

The ESD protection N-MOS transistor in the example of FIG. 1 has a conventional structure in order to simplify the description. However, the present invention is not limited thereto and other transistor structures may be employed such as an LDD structure and an offset drain structure in which the drain region 202 is distanced from the gate electrode 204 by setting a given width between the two.

What is claimed is:

1. A semiconductor device, comprising:
   an external connection terminal;
   an internal circuit region;
   an ESD protection N-MOS transistor provided between the external connection terminal and the internal circuit region to protect an internal element formed in the internal circuit region;
   a shallow trench structure provided to isolate the ESD protection N-MOS transistor;
   a thin insulating film formed on a drain region of the ESD protection N-MOS transistor; and
   an electrode disposed above the drain region and on the thin insulating film for receiving a signal from the external connection terminal;
   wherein the thin insulating film has a film thickness and film properties that allow dielectric breakdown and establish conduction between the electrode and the drain region when a voltage exceeding an absolute maximum rating of the semiconductor device is applied to the electrode.

2. A semiconductor device according to claim 1, wherein the electrode is formed of a polysilicon film.

3. A semiconductor device according to claim 1, wherein the electrode is formed of the same film as is used for a gate electrode of a MOS transistor in the internal circuit region.

4. A semiconductor device according to claim 1, wherein the thin insulating film is formed of a silicon oxide film.

5. A semiconductor device according to claim 1, wherein the thin insulating film is formed of a composite film of a silicon oxide film and a silicon nitride film.

6. A semiconductor device comprising:
   an external connection terminal;
   an internal circuit region;
   an ESD protection N-MOS transistor provided between the external connection terminal and the internal circuit region to protect an internal element formed in the internal circuit region;
   a shallow trench structure provided to isolate the ESD protection N-MOS transistor;
   a thin insulating film formed on a drain region of the ESD protection N-MOS transistor, the thin insulating film being formed of the same film as is used for a tunnel oxide film of an EEPROM formed in the internal circuit region; and
   an electrode disposed above the drain region and on the thin insulating film for receiving a signal from the external connection terminal.

7. A semiconductor device according to claim 1, wherein the ESD protection N-MOS transistor has an LDD structure.

8. A semiconductor device according to claim 1, wherein the ESD protection N-MOS transistor has an offset drain structure.

* * * * *